(12) United States Patent
Lee

(10) Patent No.: US 9,609,768 B2
(45) Date of Patent: Mar. 28, 2017

(54) WALL MOUNTING APPARATUS

(71) Applicant: HON HAI PRECISION INDUSTRY CO., LTD., New Taipei (TW)

(72) Inventor: Chien-Hung Lee, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 961 days.

(21) Appl. No.: 13/903,974

(22) Filed: May 28, 2013

(65) Prior Publication Data

US 2014/0329407 A1    Nov. 6, 2014

(30) Foreign Application Priority Data

May 2, 2013   (TW) .............................. 102208125 U

(51) Int. Cl.
*E05B 47/00* (2006.01)
*H05K 5/02* (2006.01)
*F16M 13/02* (2006.01)

(52) U.S. Cl.
CPC ........... *H05K 5/0204* (2013.01); *F16M 13/02* (2013.01); *E05B 47/00* (2013.01); *E05B 2047/0088* (2013.01); *F16M 2200/02* (2013.01)

(58) Field of Classification Search
USPC ............... 70/58, 63; 109/50–52; 248/346.03, 248/346.01, 346.06, 553, 551
See application file for complete search history.

(56) References Cited

U.S. PATENT DOCUMENTS

| | | | |
|---|---|---|---|
| 3,340,710 A * | 9/1967 | O'Brien | E05B 43/005 70/271 |
| 6,488,148 B1 * | 12/2002 | Woodson | B65D 25/10 206/1.5 |
| 2004/0099782 A1 * | 5/2004 | Schulz | A47G 33/1213 248/346.06 |
| 2010/0085148 A1 * | 4/2010 | Nesling | A47G 29/141 340/5.73 |

* cited by examiner

*Primary Examiner* — Alfred J Wujciak

(74) *Attorney, Agent, or Firm* — Zhigang Ma

(57) ABSTRACT

A wall mounting apparatus includes a container defining a mounting hole therein, a lock device received in the container, and a connector engaging with the container and the lock device to assemble the container on a determined position stably. The lock device includes a driver, an electrical connector electrically connecting the driver, and an engaging plate driven by the driver. A recess is defined in the engaging plate. One end of the connector is mounted on the determined position, and the other end thereof extends through the mounting hole and supports the container. The electrical connector is turned off to make the driver drive the engaging plate moving towards the connector to make the connector insert in the recess of the engaging plate and be clasped by the engaging plate.

14 Claims, 6 Drawing Sheets

WALL MOUNTING APPARATUS

BACKGROUND

1. Technical Field

The present disclosure relates to wall mounting apparatuses and, more particularly, to a wall mounting apparatus can be mounted on a determined position stably.

2. Description of Related Art

Generally wall mounting apparatus includes a container and connectors engaging with the container. A plurality of through holes is defined in a side of the container. A bore diameter of each through hole is larger than a diameter of the connector. An end of the connector is inserted in a corresponding through hole and the other end of the connector is fixed to a wall. Thus, the container is mounted to the wall. However, the container can be taken from the wall easy. Thus, the container is prone to be lost.

Accordingly, it is desirable to provide a wall mounting apparatus which can overcome the described limitations.

DETAILED DESCRIPTION

Embodiment of a wall mounting apparatus will now be described in detail below and with reference to the drawings.

Figure 1:
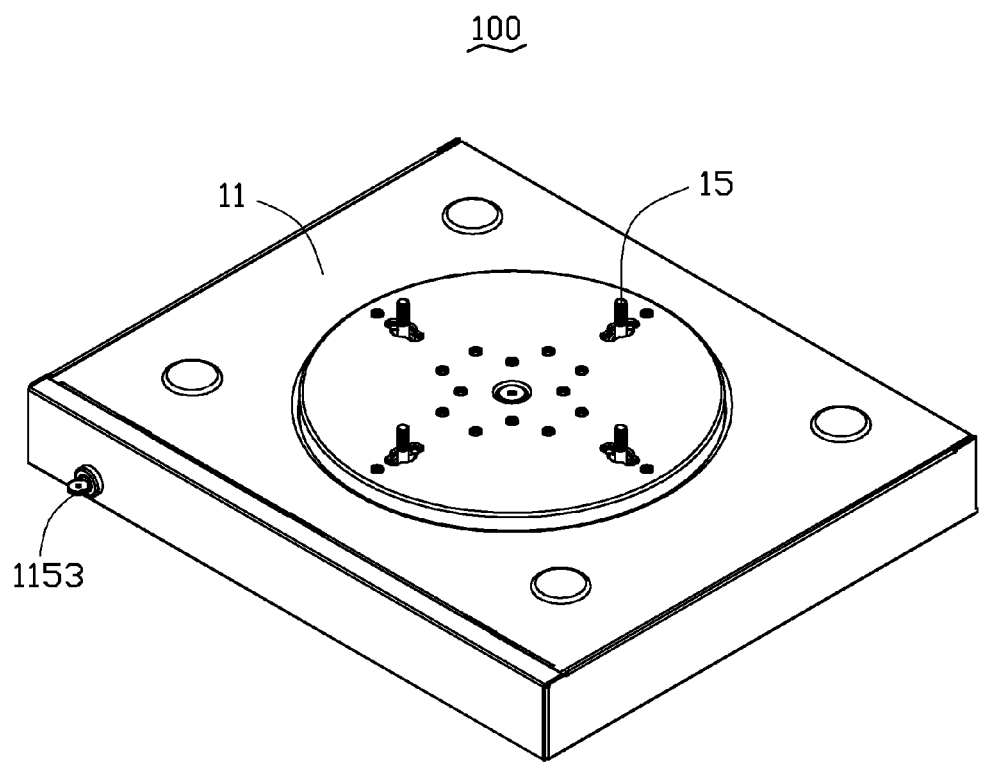
FIG. 1 is an isometric view of a wall mounting apparatus according to an exemplary embodiment of the present disclosure.
Figure 2:
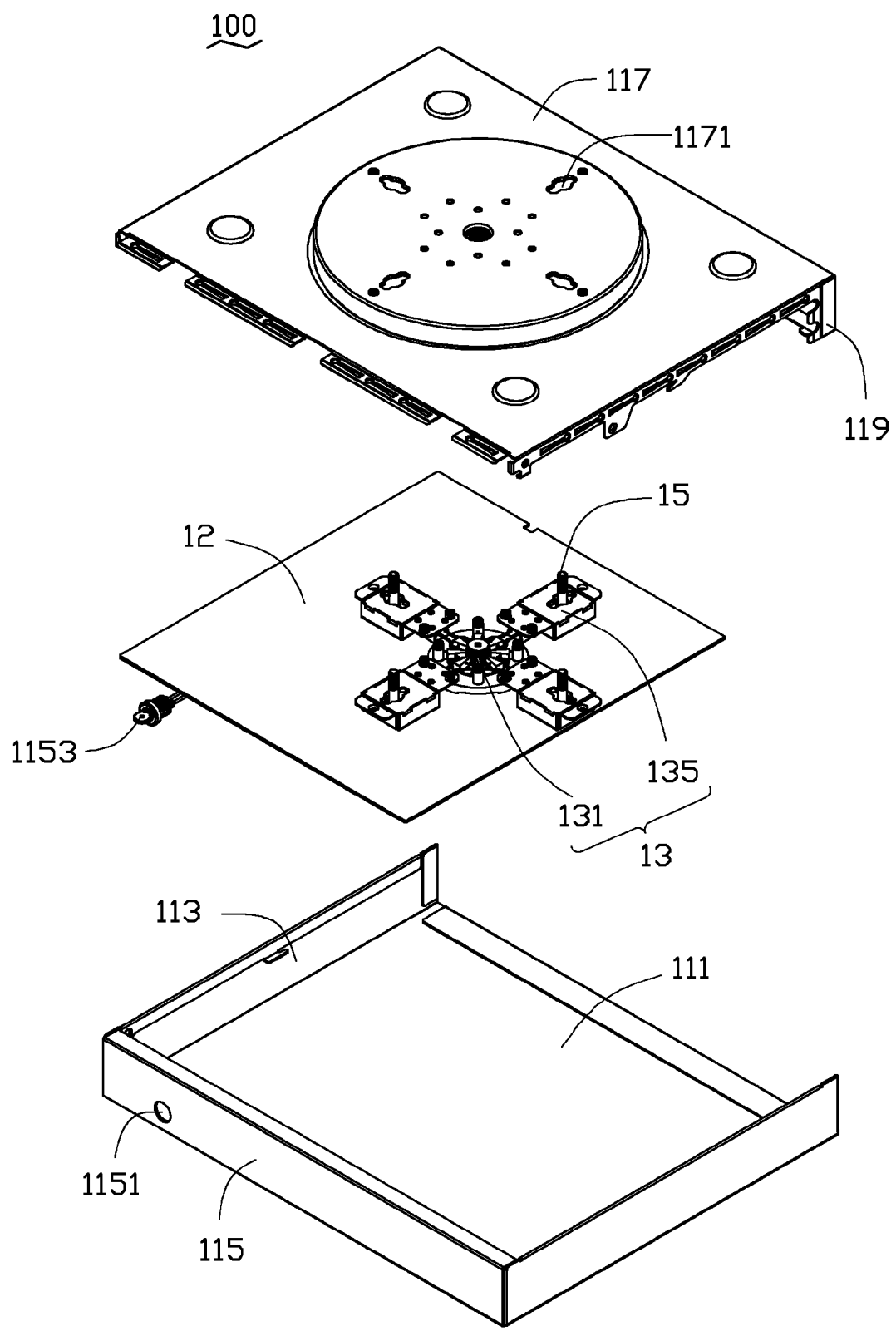
FIG. 2 is an exploded view of the wall mounting apparatus of FIG. 1.

Referring to FIGS. 1-2, a wall mounting apparatus 100 includes a container 11, a lock device 13 received in the container 11, and a plurality of connectors 15 engaging with the lock device 13 and the container 11 to fix the container 11 to a determined position, such as a wall.

The container 11 is hollow, includes a bottom plate 111, two opposite first side walls 113 extending upwardly from opposite ends of the bottom plate 111, a second side wall 115 extending upwardly from a side of the bottom plate 111 and interconnecting front ends of the first side walls 113, a top plate 117 facing the bottom plate 111 and a third side wall 119 extending downwardly from a side of the top plate 117. Top ends of the first side walls 113 and the second wall 115 abut a bottom surface of the top plate 117. A bottom end of the third side wall 119 abuts a top surface of the bottom plate 111. The third side wall 119 is sandwiched between the first side walls 113.

A socket 1151 is defined in the second side wall 115. A key 1153 engages in the socket 1151.

A plurality of mounting holes 1171 is defined in a central of the top plate 117 to allow the connectors 15 extending therethrough. A bore diameter of the mounting hole 1171 decreases from a center to opposite ends.

A supporting plate 12 is received in the container 11 to support the lock device 13. In this embodiment, the supporting plate 12 is a circuit board plate.

The lock device 13 includes an electrical connector 131 and a plurality of lock members 135 spaced from each other and surrounding the electrical connector 131 therebetween. The lock members 135 electrically connect the electrical connector 131 and are aligned with the mounting holes 1171 of the top plate 117. The electrical connector 131 electrically connects the key 1153 and a power source.

Figure 3:
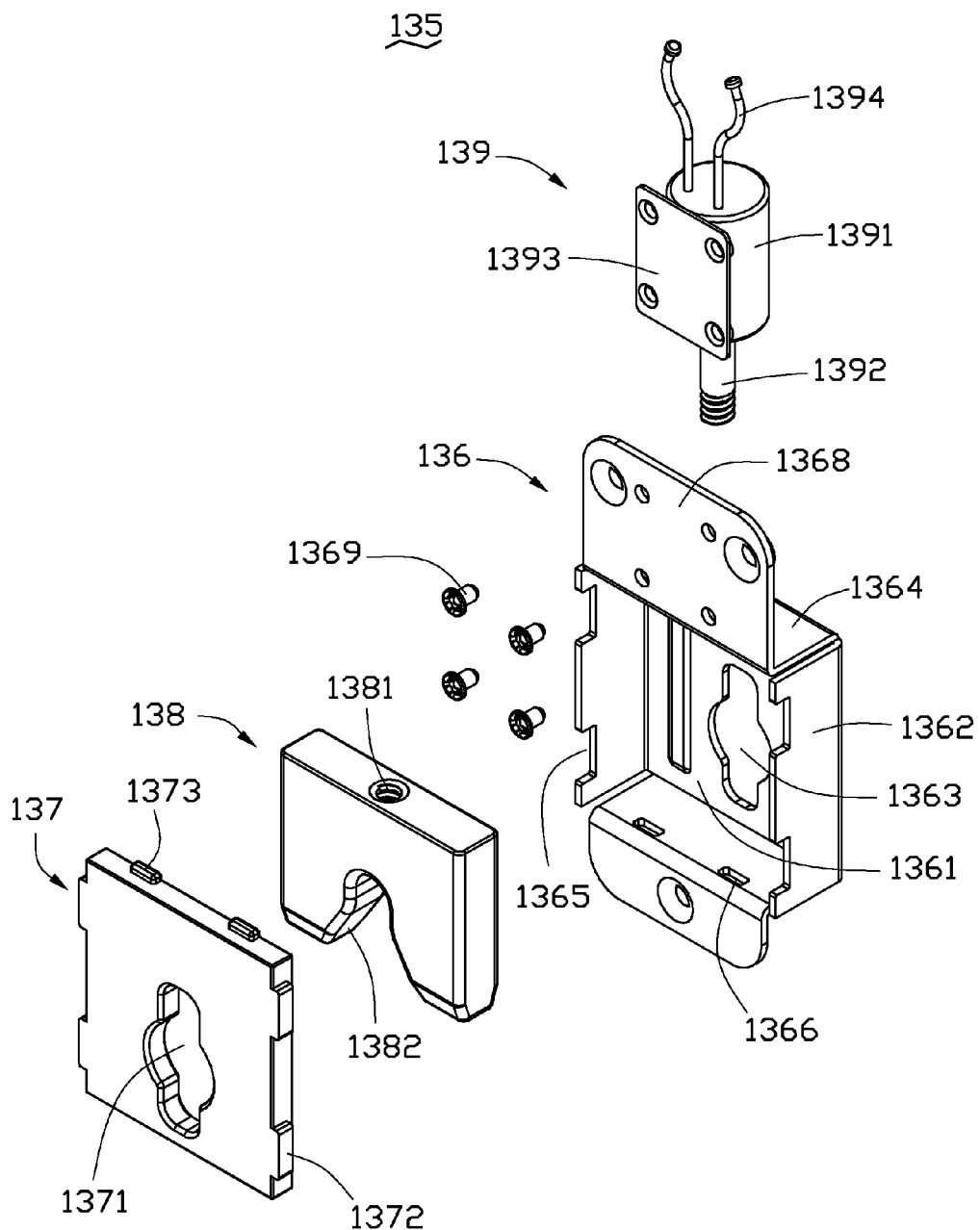
FIG. 3 is an exploded view of a lock member of the wall mounting apparatus of FIG. 1.
Figure 4:
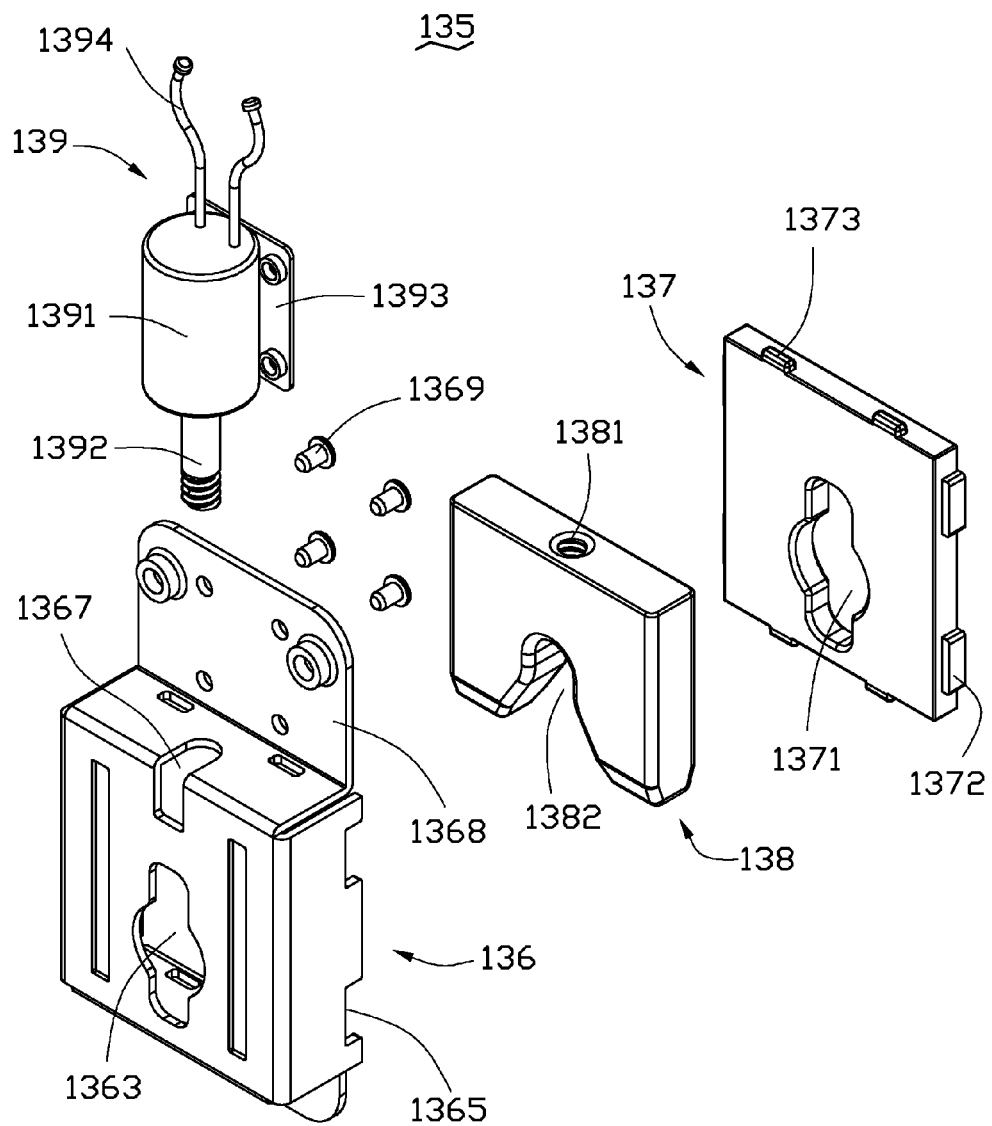
FIG. 4 is similar to FIG. 3, but shown from another aspect.

Referring to FIGS. 3-4, each lock member 135 includes a cover 136, a board 137 covering the cover 136, an engaging plate 138 located between the cover 136 and the board 137, and a driver 139 connecting the engaging plate 138 to drive the engaging plate 138.

The cover 136 includes a rectangular main body 1361, two first side plates 1362 extending from opposite sides of the main body 1361 and two second side plates 1364 extending from opposite ends of the main body 1361 and interconnecting the first side plate 1362. Each the first side plate 1362 and each the second side plate 1364 are rectangular. A first through hole 1363 is defined in the main body 1361 along a longitudinal direction of the main body 1361. A profile of the first through hole 1361 is the same as that of the mounting hole 1171 of the top plate 117. Two spaced recesses 1365 are defined in an edge of each first side plate 1362 away from the main body 1361. Two slots 1366 are defined in an edge of each second side plate 1364 away from the main body 1361. A through hole 1367 is defined in one of the second side plate 1364. Two mounting plates 1368 extend outwardly from the second side plates 1364 and are oriented toward opposite directions to allow bolts 1369 extending through to mount the lock member 135 on the supporting plate 12.

The board 137 is rectangular. A size of the board 137 is the same as that of the main body 1361. A second through hole 1371 is defined in the board 137 along a longitudinal direction of the board 137 and aligned with the first through hole 1363. Two protruding portions 1372 protrude from opposite sides of the board 137 and are received in the recesses 1365. Two protruding portions 1373 protrude from opposite ends of the board 137 and are inserted in the slots 1366 of the cover 136. In this embodiment, the protruding portions 1372, 1373 are rectangular. Alternatively, the protruding portions 1372, 1373 may be cylindrical, as long as them can be inserted into the slots 1366 and received in the recesses 1365.

A receiving space 140 is defined by the cover 136 and the board 137. The engaging plate 138 is received in the receiving space 140. In this embodiment, the engaging plate 138 is a rectangular plate. A height of the engaging plate 138 is less than a half of that of the receiving space 140. A screw hole 1381 is defined in a center of a top end of the engaging plate 138 to receive the driver 139. A recess 1382 is defined in a central portion of the bottom end to receive the connector 15 therein. Bore diameters of the recess 1382 increase from top to bottom. The largest bore diameter of the recess 1382 is less than the largest bore diameter of the mounting hole 1171.

The driver 139 includes a motor 1391, a pole 1392 extending from an end of the motor 1391, a positioning plate 1393 formed on a side of the motor 1391, and two wires 1394 extending from the other end of the motor 1391. The motor 1391 is cylindrical and a diameter thereof is larger than a bore diameter of the through hole 1367 of the cover 136. The pole 1392 is cylindrical and a diameter thereof is less than the bore diameter of the through hole 1367. The pole 1392 extends through the through hole 1367 and engages in the screw hole 1381 of the engaging plate 138 to assemble the driver 139 on the engaging plate 138. The positioning plate 1393 is assembled on one of the mounting plate 1368. The wires 1394 electrically connect the electrical connector 13.

The connector 15 includes a head 151 and a staff 153 extending downwardly from the head 151. The head 151 and the staff 153 are cylindrical. A diameter of the head 151 is larger than that of the staff 153. The diameter of the head 151 is less than the largest bore diameter of the first through hole 1363 and the second through hole 1371 and larger than the smallest bore diameter of the first through hole 1363 and the second through hole 1371. The diameter of the staff 153 is larger than the smallest bore diameter of the recess 1382.

Figure 5:
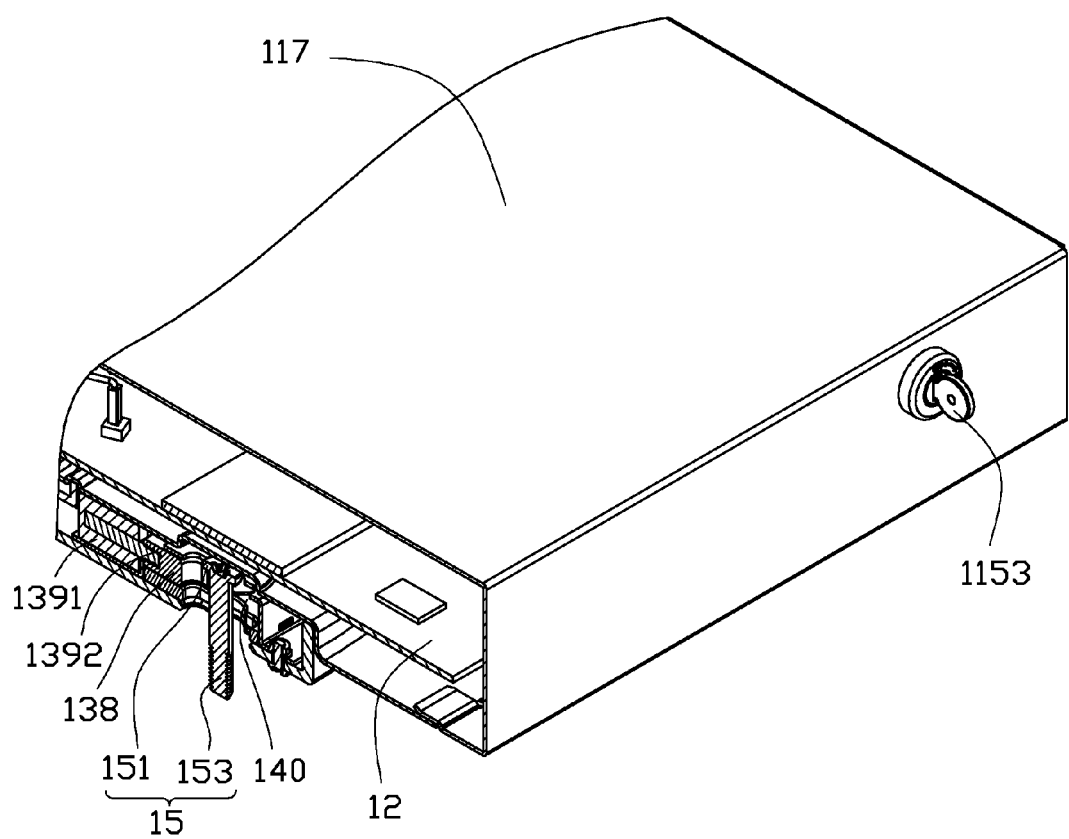
FIG. 5 is an inverted view of the wall mounting apparatus of FIG. 1, wherein a part of the wall mounting apparatus is cut to show the unlocked lock member.
Figure 6:
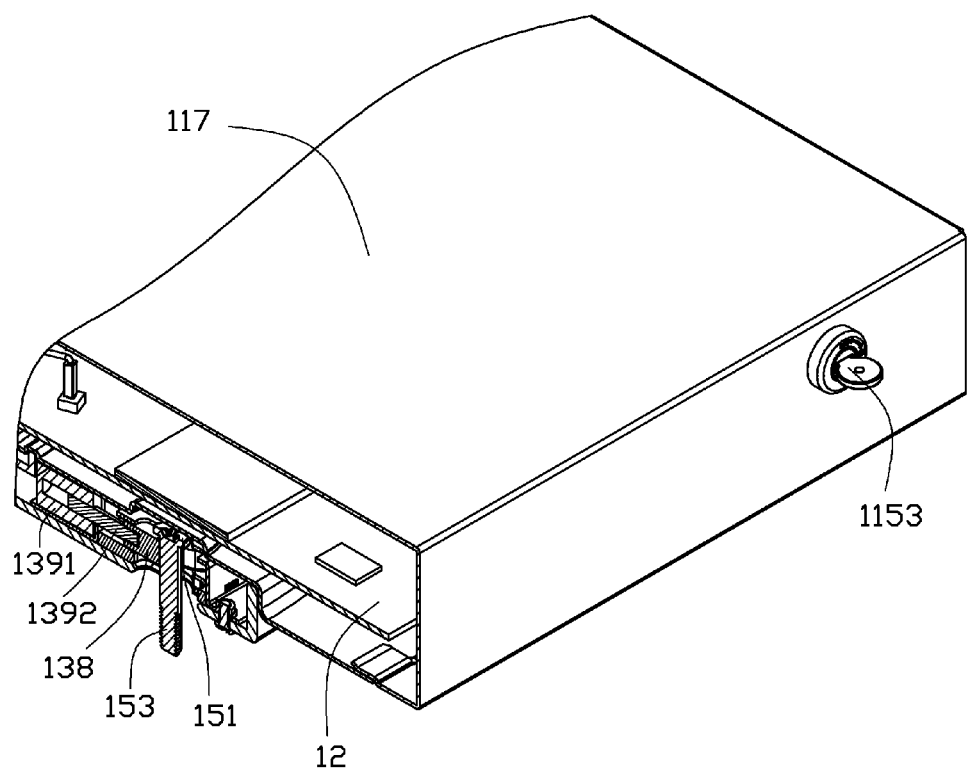
FIG. 6 is similar to the FIG. 5 but a lock member of the wall mounting apparatus being locked.

Referring to FIGS. 5-6, when the wall mounting apparatus 100 is mounted on the wall, ends of the staff 153 away from the head 151 are mounted on the wall firstly, and then the key 1153 is inserted into the socket 1151 and rotates relative to the socket 1151 to make the electrical connector 131 be turned on. In this state, the driver 139 drives the engaging plates 138 moving away from the board 137 to make the mounting holes 1171 of the top plate 117, the first through holes 1363 and the second through holes 1371 be aligned with each other. A bottom end of the recess 1382 of the engaging plate 138 is aligned with a top end of the mounting hole 1171. The container 11 is pushed towards the connectors 15 to make the heads 151 of the connectors 15 extend through the mounting holes 1171, the first through holes 1363 and the second through holes 1371. In this state, the container 11 is mounted on the connectors 15. The engaging plates 138 are spaced from the staffs 153. The key 1153 is rotated to make the electrical connector 131 be turned off. In this state, the driver 139 drives the engaging plates 138 moving towards the board 137 until the staffs 153 are inserted in the recesses 1382 and abut against the engaging plates 138. Finally, the key 1153 is taken off from the container 11. The engaging plate 138 clasps the staff 153, and the head 151 abuts a side of the engaging plate 138. In this state, the container 11 is stably mounted on the connectors 15.

It is to be further understood that the mounting hole 1171, the first through hole 1363 and the second through hole 1371 may be discretional as long as the bore diameter thereof is larger than the diameter of the head 151 of the connector. A structure of the engaging portion 138 may be discretional as long as the bore diameter thereof is less than the diameter of the staff 151.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A wall mounting apparatus comprising:
a container defining a mounting hole therein;
a lock device received in the container and comprising a driver, an electrical connector electrically connecting the driver, and an engaging plate driven by the driver, a recess being defined in the engaging plate;
a connector engaging with the container and the lock device to assemble the container on a wall, one end of the connector for being mounted on the wall, and the other end of the connector extending through the mounting hole and supporting the container;
wherein the electrical connector is turned off to make the driver drive the engaging plate moving towards the connector to make the connector insert in the recess of the engaging plate and be clasped by the engaging plate to disengage the container from the wall.

2. The wall mounting apparatus of claim 1, wherein the driver comprises a motor, a pole extending from the motor and wires electrically connecting the electrical connector, and the pole engages with the engaging plate.

3. The wall mounting apparatus of claim 2, wherein a screw hole is defined in the engaging plate, and an end of the pole engages in the screw hole.

4. The wall mounting apparatus of claim 2, wherein lock device further comprises a cover and a board engaging with the cover to define a receiving space therebetween, the engaging plate is received in the receiving space, and the pole extends through the cover to engage with the engaging plate.

5. The wall mounting apparatus of claim 4, wherein a first through hole is defined in the cover, a second through hole is defined in the board, the first through hole, the second through hole and the mounting hole are aligned with each other to allow the connector extending therethrough.

6. The wall mounting apparatus of claim 4, wherein a positioning plate is formed on the motor and mounted on the cover.

7. The wall mounting apparatus of claim 1, wherein the connector comprises a staff extending through the mounting hole and clasped by the engaging plate.

8. The wall mounting apparatus of claim 7, wherein the connector comprises a head connecting the staff and abutting the engaging plate.

9. The wall mounting apparatus of claim 1, wherein a socket is defined in the container, and a key engages in the socket and electrically connects the electrical connector and a power source.

10. A wall mounting apparatus comprising:
a container defining a mounting hole therein;
a supporting plate mounted on the container;
a lock device received in the container and mounted on the supporting plate, the lock device comprising a driver, an electrical connector electrically connecting the driver, and an engaging plate driven by the driver, a recess being defined in the engaging plate;
a connector engaging with the container and the lock device to assemble the container on a wall, one end of the connector for being mounted on the wall, and the other end of the connector extending through the mounting hole and supporting the container;
wherein the electrical connector is turned off to make the driver drives the engaging plate moving towards the connector to make the connector insert in the recess of the engaging plate and be clasped by the engaging plate to disengage the container from the wall.

11. The wall mounting apparatus of claim 10, wherein the connector comprises a staff, the staff extends through the mounting hole and is clasped by the engaging plate.

12. The wall mounting apparatus of claim 11, wherein the connector further comprises a head connecting the staff and abutting the engaging plate.

13. The wall mounting apparatus of claim 10, wherein the driver comprises a motor, a pole extending from the motor and wires electrically connecting the electrical connector, and the pole engages with the engaging plate.

14. The wall mounting apparatus of claim 13, wherein a screw hole is defined in the engaging plate, and an end of the pole engages in the screw hole.

\* \* \* \* \*